(12) United States Patent
Dai

(10) Patent No.: US 8,857,089 B2
(45) Date of Patent: Oct. 14, 2014

(54) ELECTRONIC DEVICE FRAME

(75) Inventor: Bin Dai, ShenZhen (CN)

(73) Assignees: Fu Tai Hua Industry (Shenzhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 17 days.

(21) Appl. No.: 12/965,855

(22) Filed: Dec. 11, 2010

(65) Prior Publication Data

US 2012/0032568 A1 Feb. 9, 2012

(30) Foreign Application Priority Data

Aug. 5, 2010 (CN) .......................... 2010 1 0246204

(51) Int. Cl.
| | | |
|---|---|---|
| A47G 1/06 | (2006.01) | |
| H05K 5/00 | (2006.01) | |
| G09F 1/12 | (2006.01) | |
| H04M 1/02 | (2006.01) | |

(52) U.S. Cl.
CPC ................ *H05K 5/0017* (2013.01); *G09F 1/12* (2013.01); *A47G 1/06* (2013.01); *H04M 1/0266* (2013.01)
USPC ................... 40/790; 40/791; 40/794; 40/792; 40/209; 40/784; 40/785; 40/782; 40/739; 206/449; 206/454; 206/39

(58) Field of Classification Search
CPC ................................... A47G 1/06; G09F 1/12
USPC ........... 40/790, 791, 792, 794, 784, 785, 782, 40/739; 206/449, 454, 39
See application file for complete search history.

(56) References Cited

U.S. PATENT DOCUMENTS

| | | | | |
|---|---|---|---|---|
| 3,851,415 A | * | 12/1974 | Vihma ............................ | 40/784 |
| 5,109,619 A | * | 5/1992 | Noggle ........................... | 40/737 |
| 5,276,984 A | * | 1/1994 | Burns ............................. | 40/791 |
| 5,974,714 A | * | 11/1999 | Jones ............................. | 40/768 |
| 6,615,526 B2 | * | 9/2003 | Pitcher et al. ................... | 40/790 |

FOREIGN PATENT DOCUMENTS

| | | |
|---|---|---|
| CN | 102348358 A | 2/2012 |
| TW | 200912443 A | 3/2009 |

* cited by examiner

*Primary Examiner* — Syed A Islam
(74) *Attorney, Agent, or Firm* — Novak Druce Connolly Bove + Quigg LLP

(57) ABSTRACT

A frame of an electronic device is a closed frame and made of plastic material. The frame forms one or more tooth structures at the corners of the frame to extend further out or to be compactly arranged to be pushed closer together for changing a size of the frame. Each tooth structure includes a plurality of rectangular teeth and a plurality of trapezoidal teeth. The trapezoidal teeth are positioned between the rectangular teeth.

7 Claims, 4 Drawing Sheets

ELECTRONIC DEVICE FRAME

CROSS-REFERENCE TO RELATED APPLICATIONS

This application is related to one co-pending U.S. patent application, which is: application Ser. No. 12/965,854, and entitled "FRAME OF ELECTRONIC DEVICE". Such application has the same assignee as the instant application and are concurrently filed herewith. The disclosures of the above-identified application is incorporated herein by reference.

BACKGROUND

1. Technical Field

The present disclosure relates generally to electronic device housings and, more particularly, to a frame of an electronic device of plastic material.

2. Description of Related Art

Electronic device frames are used for positioning and holding display panels, and are generally made of plastic material by injection molding.

However, the frames formed by injection molding often experience size errors as compared to a predetermined size, due to the limitations on manufacturing precision of the injection molds and the properties of the plastic material. If a formed size of a frame is smaller than the predetermined size of the frame, the frame may be scratched by the display panel in an assembly process of the electronic device. If the formed size of the frame is larger than the predetermined size of the frame, the display panel located in the frame may separate from the frame and fall down, thereby suffering damages.

Therefore, there is room for improvement within the art.

BRIEF DESCRIPTION OF THE DRAWINGS

The components in the drawings are not necessarily drawn to scale, the emphasis instead placed upon clearly illustrating the principles of the present disclosure. Moreover, in the drawings, like reference numerals designate corresponding parts throughout the several views.

DETAILED DESCRIPTION

Figure 1:
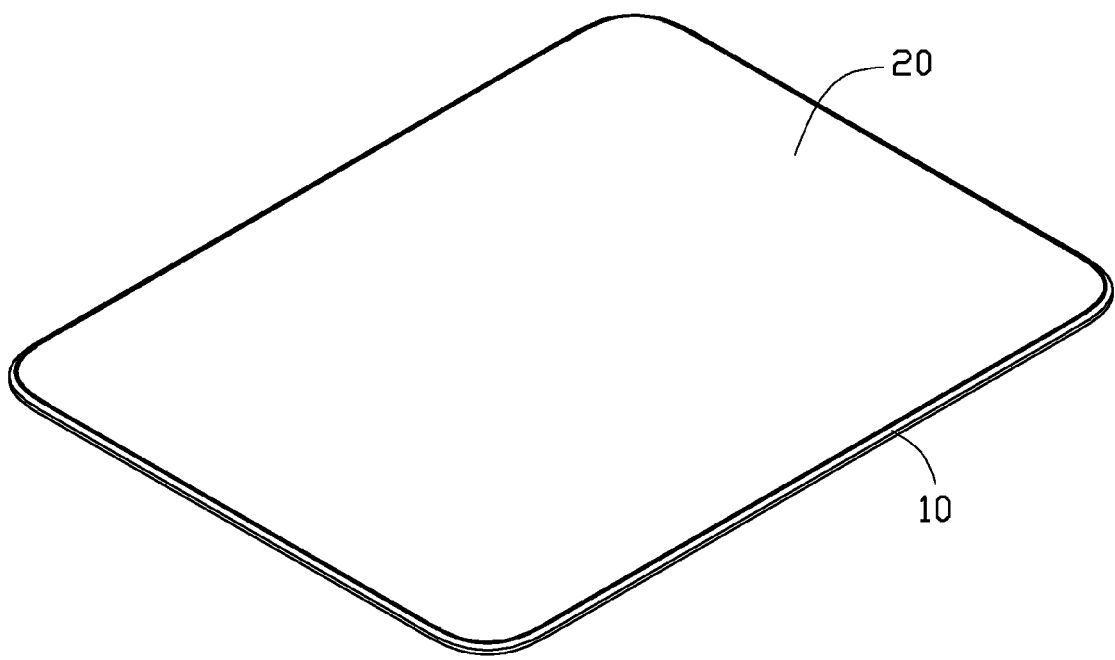
FIG. 1 is an isometric view of a first embodiment of an electronic device frame holding a glass sheet.
Figure 2:
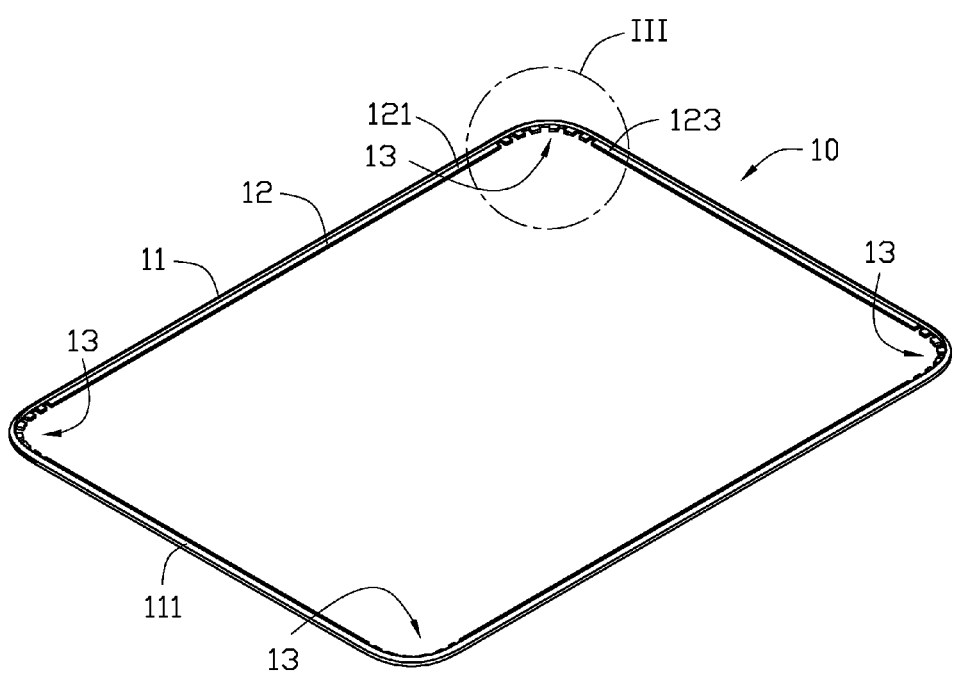
FIG. 2 is another isometric view of the frame of FIG. 1 viewed from another perspective.
Figure 3:
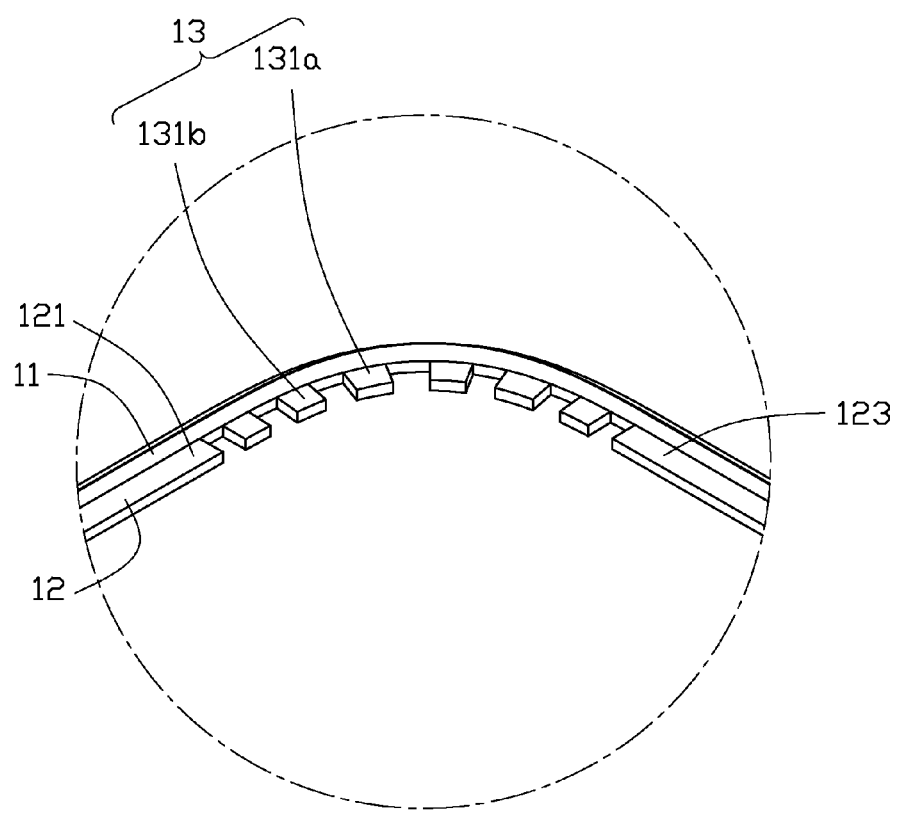
FIG. 3 is an enlarged view of a portion of the frame as denoted by the dashed circle labeled as III of FIG. 2.

Referring to FIGS. 1 through 3, a first embodiment of a frame 10 of an electronic device (not shown) is used for mounting a glass sheet 20 of a display panel (not shown). The frame 10, integrally formed of plastic material, is a closed frame, which includes a positioning portion 11 and a support portion 12 extending from an inner surface of the positioning portion 11. An outer surface of the positioning portion 11 forms an angled surface 111. The support portion 12 forms a plurality of tooth structures 13. Each tooth structure 13 includes a plurality of first teeth 131a and a plurality of second teeth 131b separately arranged. In the illustrated embodiment, the frame 10 is substantially rectangular. The frame 10 forms four tooth structures 13 in four round corners thereof respectively. The support portion 12 is substantially rectangular, and includes a pair of first sections 121 and a pair of second sections 123. The pair of first sections 121 is parallel to each other, the pair of second sections 123 is parallel to each other. Each tooth structure 13 is partially formed on the first section 121 and partially formed on the section 123 perpendicular to the first section 121. The plurality of first teeth 131a and the plurality of second teeth 131b are inclined toward each other and extend toward a center of the corner. Each tooth structure 13 includes four second teeth 131b and two first teeth 131a, and the first teeth 131a are positioned between the second teeth 131b. The first teeth 131a are substantially trapezoidal, and the second teeth 131b are substantially rectangular. Each corner of the frame 10 is chamfered. The first teeth 131a and the second teeth 131b are separately arranged along an inner surface of each corner of the frame 10.

In assembling the glass sheet 20 to the frame 10, if the frame 10 formed by the plastic material is smaller than a predetermined size, the first teeth 131a and the second teeth 131b can be separately extended further out to slightly enlarge the size of the frame 10. If the frame 10 formed by the plastic material is larger than the predetermined size, the first teeth 131a and the second teeth 131b can be compactly arranged to be pushed closer together as driven by other components (not shown) of the electronic device, thus tightly holding the glass sheet 20.

It should be appreciated that the frame 10 can be other shapes, such as hexagonal. In addition, the tooth structure 13 may include one or more teeth.

Figure 4:
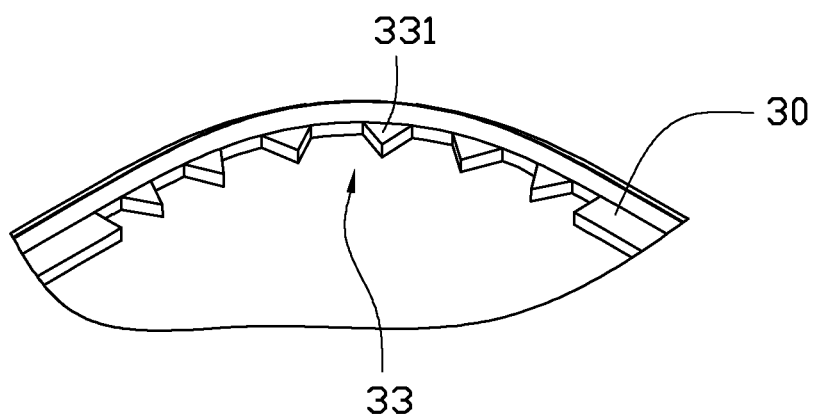
FIG. 4 is a partial, isometric view of a second embodiment of a electronic device frame.

Referring to FIG. 4, a second embodiment of a frame 30 of the electronic device differs from the frame 10 in the first embodiment in that the teeth 331 of each tooth structure 33 are triangular, thereby further increasing a changeable size of the frame 30. It should be pointed out that the tooth structures 33 can be of other shapes, such as curved.

It is believed that the present embodiments and their advantages will be understood from the foregoing description, and it will be apparent that various changes may be made thereto without departing from the spirit and scope of the disclosure or sacrificing all of its material advantages.

What is claimed is:

1. A frame of an electronic device comprising: a closed flame comprising a rectangular positioning portion and a plurality of round corners, and a support portion extending from an inner surface of the positioning portion towards an inner surface of the closed frame, the support portion forming at least one tooth structure, wherein the frame is made of plastic material, the plurality of corners is chamfered, and the at least one tooth structure is extended further out or compactly arranged; the at least one tooth structure comprises a plurality of teeth separately and directly arranged longitudinally along an inner surface of each of the plurality of corners, such that each of the plurality of teeth is fixedly and unmovably connected to the inner surface of the each of the plurality of corners of the closed frame, and only the plurality of corners is elastic for changing a size of the frame, the support portion comprises at least one first section and at least one second section substantially perpendicular to the at least one first section, the at least tooth structure is partially formed on the first section and partially formed on the second section, the plurality of teeth are inclined toward each other and extend toward a center of the corresponding one corner.

2. The frame of claim 1, wherein at least one of the plurality of teeth is trapezoidal.

3. The frame of claim 1, wherein at least one of the plurality of teeth is rectangular.

4. The frame of claim 1, wherein each of the plurality of teeth is triangular.

5. The frame of claim 1, wherein the at least one tooth structure comprises a plurality of rectangular teeth and a plurality of trapezoidal teeth, and the trapezoidal teeth are positioned between the rectangular teeth.

6. The frame of claim 1, wherein the frame is substantially rectangular.

7. The frame of claim 1, wherein an outer surface of the positioning portion forms an angled surface.

* * * * *